US006649451B1

(12) United States Patent
Vyvoda et al.

(10) Patent No.: US 6,649,451 B1
(45) Date of Patent: Nov. 18, 2003

(54) STRUCTURE AND METHOD FOR WAFER COMPRISING DIELECTRIC AND SEMICONDUCTOR

(75) Inventors: Michael A. Vyvoda, Fremont, CA (US); James M. Cleeves, Redwood City, CA (US); Calvin K. Li, Fremont, CA (US); Samuel V. Dunton, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 34 days.

(21) Appl. No.: 09/776,000

(22) Filed: Feb. 2, 2001

(51) Int. Cl.[7] .................. H01L 21/82; H01L 21/00; H01L 21/8238; H01L 21/3205; H01L 21/469
(52) U.S. Cl. .................. 438/128; 438/164; 438/233; 438/586; 438/669; 438/692; 438/787
(58) Field of Search .................. 438/128–132, 438/164, 233, 586, 587, 669, 692, 778, 787, 488, 490, 491, 631, 633, 684, 129, 130

(56) References Cited

U.S. PATENT DOCUMENTS

| 4,811,082 | A | | 3/1989 | Jacobs et al. | |
|---|---|---|---|---|---|
| 5,160,987 | A | | 11/1992 | Pricer et al. | |
| 5,835,396 | A | | 11/1998 | Zhang | |
| 5,923,612 | A | | 7/1999 | Park et al. | |
| 5,976,953 | A | | 11/1999 | Zavracky et al. | |
| 5,985,693 | A | | 11/1999 | Leedy | |
| 6,004,187 | A | * | 12/1999 | Nyui et al. | 451/5 |
| 6,034,882 | A | | 3/2000 | Johnson et al. | |
| 6,197,641 | B1 | | 3/2001 | Hergenrother et al. | |
| 6,270,353 | B1 | * | 8/2001 | Andrews et al. | 438/424 |
| 6,303,484 | B1 | * | 10/2001 | Chen | 438/595 |
| 6,406,961 | B1 | * | 6/2002 | Chen | 438/266 |
| 6,420,215 | B1 | * | 7/2002 | Knall et al. | 438/131 |

FOREIGN PATENT DOCUMENTS

EP 0 395 886 A2 11/1990

OTHER PUBLICATIONS

Brian Dipert, "Exotic Memories, Diverse Approaches", Edn Asia, Sep. 2001, 22–33.
U.S. patent application Ser. No. 09/560,626, Knall, filed Apr. 28, 2000.

* cited by examiner

Primary Examiner—Caridad Everhart
Assistant Examiner—Chuong Luu
(74) Attorney, Agent, or Firm—Pamgla J. Squyres

(57) ABSTRACT

Wafers of the present invention comprise a semiconductor layer and a dielectric layer. The semiconductor layer is patterned to form semiconductor regions, and the dielectric layer is deposited on top of the semiconductor layer. Chemical mechanical planarization (CMP) is performed to remove a portion of the dielectric layer, exposing the upper surfaces of the semiconductor regions. The amount of CMP necessary to expose all of the semiconductor regions on the wafer is reduced, because the dielectric is targeted to deposit up to the upper edge of the semiconductor regions in the spaces in between the semiconductor regions. This technique reduces non-uniformities in the thickness of the dielectric and semiconductor layers across the wafer. The thickness of the dielectric or semiconductor layer deposited on polish monitor pads located at the edges of each die may be monitored to determine when enough CMP has been performed to expose each of the semiconductor regions.

32 Claims, 6 Drawing Sheets

STRUCTURE AND METHOD FOR WAFER COMPRISING DIELECTRIC AND SEMICONDUCTOR

BACKGROUND OF THE INVENTION

The present invention relates to a structure and a method for forming a wafer comprising semiconductor and dielectric material. More specifically, this invention relates to a structure and method in which a dielectric layer is deposited at a specified thickness above a semiconductor layer.

Previously known structures referred to as inter-layer dielectric (ILD) and inter-metal dielectric (IMD) comprise a layer of dielectric deposited on top of another layer such as metal. The dielectric is typically overfilled to twice the dielectric thickness that is required in the final structure. Chemical mechanical planarization (CMP) is then performed to reduce the thickness of the dielectric layer to the required level. For example, a 20,000 angstroms thick layer of dielectric may be deposited on top of a 6,000 angstroms thick layer of metal. CMP may then be performed to reduce the thickness of the dielectric layer to 10,000 angstroms.

Another previously know technique referred to as shallow trench isolation (STI) involves depositing a dielectric layer in a trench. The dielectric layer is typically overfilled by 100% of the depth of the trench. For example, for a trench that is 3,000 angstroms deep, a dielectric layer may be formed on top of the trench that is 6,000 angstroms thick. CMP may then be performed to reduce the thickness of the dielectric layer to the desired thickness (e.g., 3,000 angstroms).

However, the thickness of deposited layers such as dielectric are often non-uniform across a wafer due to irregularities in the deposition process. Non-uniformities increase as more material is deposited to increase the thickness of the layer. Also, the CMP process may introduce additional non-uniformities into the thickness of deposited layers across the surface of a wafer. Non-uniformities due to the CMP process increase as more CMP is performed over a longer period of time.

In previously known inter-metal dielectric (IMD) layers, CMP is performed on the deposited inter-metal dielectric layer. Substantial dielectric remains above a metal layer following CMP to minimize capacitance. The surface of the underlying metal layer is not planarized. It can be assumed that the thickness of the metal layer is fixed across the wafer, because CMP has not been performed directly upon the metal layer. The thickness of the inter-metal dielectric layer can be measured using reflectance spectroscopy.

It would therefore be desirable to provide a process and structure comprising a wafer with a dielectric layer and a semiconductor layer in which the deposition of dielectric and chemical mechanical planarization on the dielectric layer are reduced.

It would also be desirable to provide a process and structure comprising a wafer with a dielectric layer and a semiconductor layer in which non-uniformities in layer thickness across the wafer are reduced.

SUMMARY OF THE INVENTION

It is an object of the present invention to provide a process and structure comprising a wafer with a dielectric layer and a semiconductor layer in which the deposition of dielectric and chemical mechanical planarization on the dielectric layer are reduced.

It is also an object of the present invention to provide a process and structure comprising a wafer with a dielectric layer and a semiconductor layer in which non-uniformities in layer thickness across the wafer are reduced.

Wafers of the present invention comprise a semiconductor layer and a dielectric layer deposited on top of the semiconductor layer. The semiconductor layer is patterned and etched to form semiconductor regions. The dielectric layer is formed on top of and in between the semiconductor regions. Chemical mechanical planarization (CMP) is then performed to remove a portion of the dielectric layer, exposing a predetermined amount of the semiconductor regions. The deposition of dielectric and the amount of CMP necessary to expose all of these semiconductor regions are both reduced, because the dielectric is targeted to fill up gaps in between the semiconductor regions only up to the upper surface of the semiconductor regions. This technique reduces non-uniformities in the thickness of the dielectric and semiconductor layers across the wafer.

The thickness of the dielectric or semiconductor layer deposited on polish monitors located at the edges of each die may be monitored to determine when enough CMP has been performed to expose all of the semiconductor regions. The thickness of the dielectric gap fill regions may be determined by using reflectance spectroscopy or other techniques, even when CMP has been performed on the semiconductor layer below. Dummy arrays may be formed next to active arrays in a memory device with rail stacks to further reduce variations in the thickness of the layers caused by CMP.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE PREFERRED EMBODIMENT

Structures and methods of the present invention comprise a patterned semiconductor layer and a dielectric layer formed on top of the semiconductor layer. The dielectric layer is deposited on top of the semiconductor layer. The dielectric is targeted to fill the gaps in between the patterned semiconductor layer up to the upper edge of the semiconductor layer.

A designer may wish to expose the upper surfaces of certain regions of the patterned semiconductor layer (hereinafter referred to as the semiconductor regions) by removing all of the dielectric on top of these regions. These pre-selected semiconductors regions may comprise all or just a portion of the surface area of the wafer. Chemical mechanical planarization (CMP) is performed to remove portions of the dielectric layer to expose the upper surfaces of each of these pre-selected semiconductor regions on the wafer. Portions of a sacrificial region of the semiconductor layer may be removed during the planarization process. By not overfilling the structure with dielectric, the amount of dielectric deposited and the time needed to planarize the wafer to expose each of the semiconductor regions are both reduced. As a result, non-uniformities in the thickness of the dielectric and semiconductor layers across the wafer are advantageously reduced.

FIGS. 1A–1D are cross sectional diagrams illustrating process steps for a first embodiment of the present invention. In the first process step, semiconductor layer 10 is deposited on top of region 12 using, for example, chemical vapor deposition (CVD). Semiconductor layer 10 may, for example, comprise silicon, gallium arsenide, germanium, or polysilicon doped with n-type or p-type dopants. A portion of the thickness of layer 10 measured from the upper surface of layer 10 as indicated by arrow 11 is referred to as the sacrificial region. Some or all of sacrificial region 11 may be removed during the subsequent planarization step. Region 12 may, for example, comprise a single layer such as a silicon layer, or multiple layers such as layers of doped silicon and conductor. In a further embodiment, region 12 may be eliminated, and semiconductor layer 10 be deposited directly on top of an insulating layer.

Figure 1A:
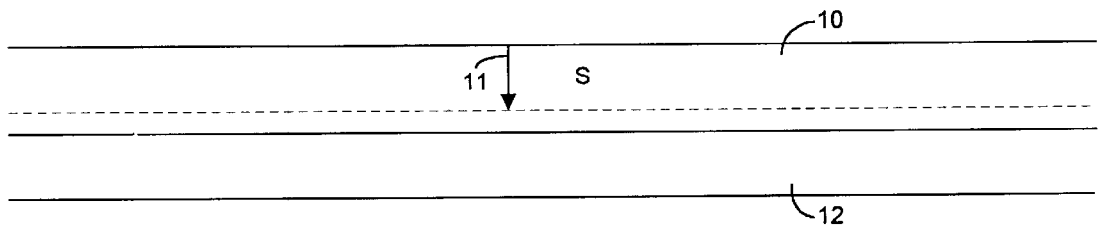
FIGS. 1A–1D are cross sectional diagrams showing process steps involving the formation of semiconductor and dielectric regions in accordance with the principles of the present invention.
Figure 1B:
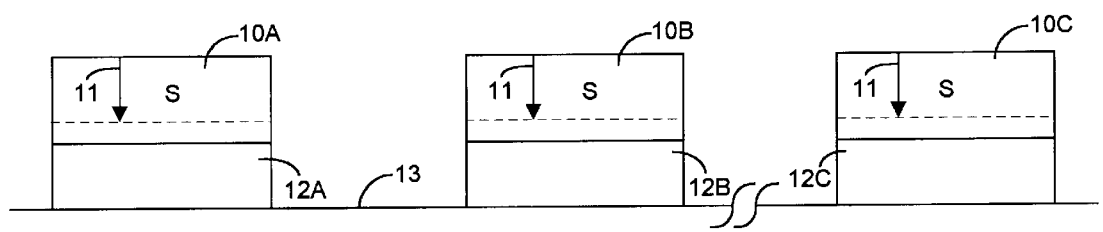

Subsequently, a masking and etching step is now used to define regions of semiconductor layer 10, such as regions 10A–10C, and regions 12A–12C of layer 12 shown in FIG. 1B. An ordinary masking and etching step for instance using plasma etching, may be used. Etchants can be used that stop on layer 13, thus preventing this layer from being etched away. Layer 13 may comprise, for example, an insulating or dielectric layer such as silicon dioxide. Regions 10A and 10B are adjacent regions on the same die. Region 10C is a semiconductor region on different die, but on the same wafer as regions 10A–10B, as shown by the broken lines between them. The semiconductor regions of layer 10 (such as regions 10A–10C) may be formed as, for example, elongated strips (i.e., that extend in to and out of the page), or rectangular regions. Regions 10A–10C, for example, may be used as arrays in a memory device structure.

Figure 1C:
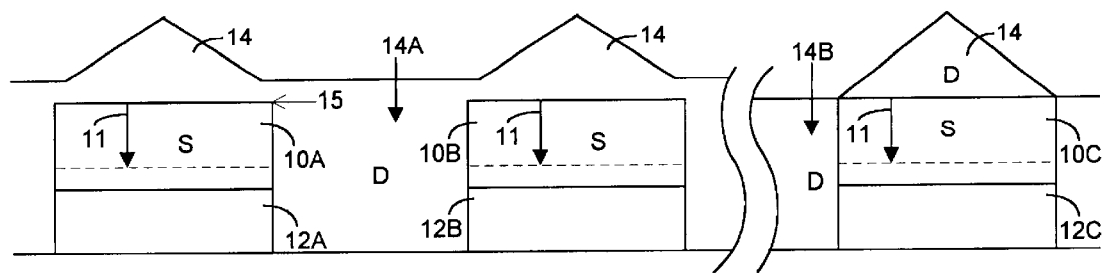

Next, dielectric layer 14 is deposited on top of semiconductor layer 10 as shown in FIG. 1C by, for example, high density plasma chemical vapor deposition (HDP-CVD). Dielectric layer 14 fills the gaps between the semiconductor regions. These are called the gap fill regions of dielectric 14 (e.g., gap fill region 14A between semiconductor regions 10A–10B). A portion of dielectric layer 14 also accumulates on top of the semiconductor regions 10A–10C in triangular shapes. Dielectric 14 is targeted to fill the gap fill regions up to the upper surface 15 of the semiconductor layer 10. However, portions of dielectric 14 that are sputtered from the top of semiconductor regions 10A–10C redeposit into the gap fill regions. This sputtering process causes dielectric layer 14 to form in triangular shapes above semiconductor regions 1A–10C as shown in FIG. 1C.

This sputtering process may cause some of the gap fill regions on the wafer such as region 14A to overfill above upper surface 15 of semiconductor regions 10A–10B by a small amount (e.g., 600 angstroms) as shown in FIG. 1C, even though the dielectric is targeted to only fill up to the upper surface 15 of semiconductor layer 10. Due to non-uniformities in the deposition process, the thickness of layer 14 varies across the wafer. Thus, other gap fill regions on different portions of the same wafer may fill up exactly to upper surface 15 of semiconductor layer 10, such as gap fill region 14B. Still other gap fill regions of layer 14 on other portions of the same wafer may fill up below upper surface 15 of layer 10.

Thus, the actual thickness of dielectric 14 in the gap fill regions may be greater, equal to, or less than the combined thickness of layer 10 and region 12 after deposition. If desired, dielectric 14 may be targeted to fill up to slightly above or below upper surface 15 of the semiconductor regions. In general, it is preferred that the gap fill regions of dielectric layer 14 fill up to or above upper surface 15 after deposition is completed.

Figure 1D:
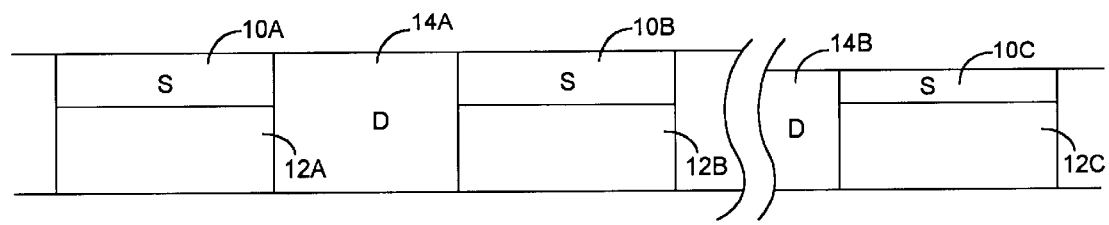

Chemical mechanical planarization (CMP) is then performed to remove a portion of dielectric layer 14 to expose semiconductor regions 10A–10C as shown in FIG. 1D. CMP is performed to remove dielectric from the upper surfaces of all of the pre-selected semiconductor regions. For example, the upper surfaces of all of the semiconductor regions of layer 10 that are to be used for active electrical connections may be exposed after the CMP step. If desired, dielectric may remain on other regions of layer 10 that are not used for electrical connections such as the polish monitor pads discussed below after CMP.

Some or all of sacrificial region 11 may be removed during the CMP step. At least a portion of semiconductor layer 10 remains following CMP in regions such as 10A–10C. The dielectric gap fill regions such as 14A–14B fill the gaps between the semiconductor regions. The height of the gap fill regions roughly equals the height of semiconductor regions 10A–10C after CMP.

The thickness of layer 14 is typically non-uniform across the wafer, because of irregularities that exist in the deposition and planarization process. For example, a wafer may be concave in shape such that layer 14 is thinner in the center of the wafer than it is on the edge of the wafer. These non-uniformities are undesirable and should be minimized during the processing steps.

Sacrificial region 11 of semiconductor layer 10 is designed to account for non-uniformities in the thickness of layer 14 that exist across the wafer. The CMP removal step discussed above is performed long enough to expose regions 10A–10C of semiconductor layer 10. Because non-uniformities in the dielectric layer 14 thicknesses exist across the wafer, the upper surface of layer 14 is higher in some parts of the wafer than in others. It takes longer for the CMP process to expose semiconductor layer 10 in portions of the wafer where layer 14 is thicker (e.g., near regions 10A–10B) than in portions of the wafer where layer 14 is thinner (e.g., near region 10C). Therefore, some of the semiconductor regions of layer 10 are exposed sooner than others during the CMP process. Once a semiconductor region such as 10C is exposed during CMP, sacrificial region 11 of layer 10 begins to be removed as CMP progresses. In regions of the wafer where layer 14 is thinner such as region 10C (e.g., at the center of the wafer), more of sacrificial layer 11 is removed during the CMP removal step than in regions of the wafer where layer 14 is thicker such as regions 10A–10B (e.g., at the edge of the wafer). Thus, sacrificial region 11 is at least as thick as the maximum variation in the height of layer 14 across the wafer with an additional allowance for non-uniformities in the CMP process itself. This ensures that the semiconductor regions of layer 10 have a minimum thickness after CMP is completed. The percentage of non-uniformity in the height of layer 14 across a wafer typically falls within an expected range and calculations can be based on that range.

The structure and methods of the present invention reduce non-uniformities in the thickness of the dielectric and semiconductor layers across the wafer by reducing the amount of dielectric deposited on semiconductor layer 10 and by reducing the amount of CMP time needed to expose each of the semiconductor regions of layer 10. The amount of non-uniformity in the thickness of a deposited dielectric layer across a wafer increases as more dielectric is deposited. Therefore, only enough dielectric is deposited in layer 14 as is needed to fill the gaps between the semiconductor regions of layer 10. Dielectric layer 14 in these gaps is targeted to fill up to upper surface 15 of semiconductor layer 10, but may in practice fill up slightly lower or higher, as discussed above. Thus, non-uniformities in the thickness of layer 14 across the wafer are reduced, because the amount of dielectric deposited in between the semiconductor regions is reduced.

In addition, the amount of non-uniformity in the thickness of the layers on a wafer increases as the amount of CMP time increases, due to irregularities in the CMP process itself. Thus, it is advantageous to reduce the amount of CMP time. As the thickness of dielectric layer 14 increases, more CMP time is required to reduce the thickness of layer 14 to expose each of the pre-selected semiconductor regions of layer 10 on the wafer. The amount of CMP time needed to expose all of the pre-selected semiconductor regions of layer 10 is reduced, because the amount of dielectric 14 deposited is reduced.

The amount of planarization performed during the CMP removal step may be monitored on polish monitor pads to ensure that all of the semiconductor regions of layer 10 are exposed. Polish monitor pads are regions that are typically located at varying intervals on the scribe lines outside each die on a wafer. However, polish monitor pads may reside within the die itself. The amount of CMP removal that occurs on a polish monitor pad can be correlated with the amount of CMP removal that has occurred in the active semiconductor regions such as 10A–10C. When processing is completed and the wafer has been completely formed, the polish monitor pads on the scribe lines are cut off when the dies are individually cut from the wafer.

Figure 2A:
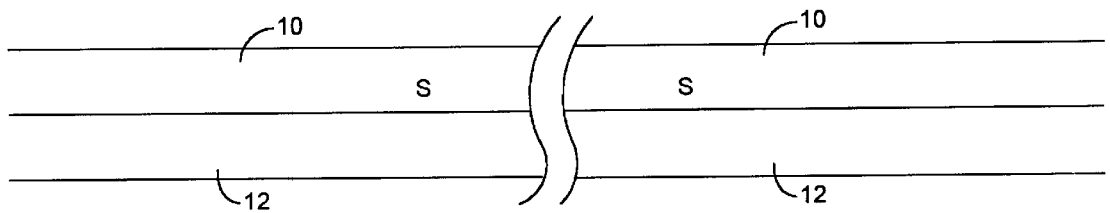
FIGS. 2A–2D are cross sectional diagrams showing process steps involving the formation and planarization of dielectric on top of polish monitors on different die in accordance with the principles of the present invention.
Figure 2B:
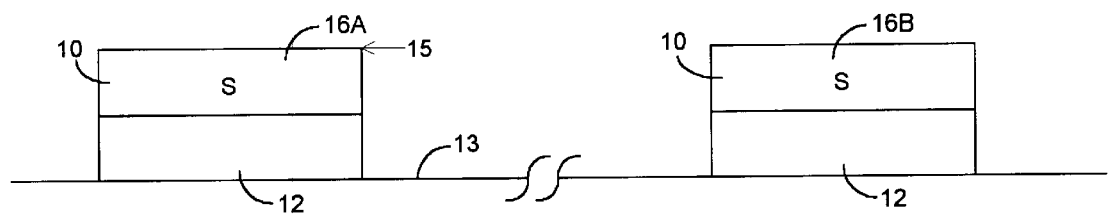

Example process steps for polish monitor pads of the present invention formed on different die are illustrated in FIGS. 2A–2D. In the first process step, semiconductor layer 10 such as silicon is deposited on top of region 12 (e.g., using CVD) as shown in FIG. 2A. Region 12 may comprise a single layer or multiple layers of silicon, conductor, or other materials as discussed above. Subsequently, a masking and etching step is used to define polish monitor pads, such as pads 16A and 16B shown in FIG. 2B. Layer 13 is used as an etch stopping layer. Polish monitor pads 16A and 16B are the same size and are located on different die, but on the same wafer as indicated by the broken line between them. Polish monitor pads 16A and 16B include portions of layer 10 and region 12. The polish monitor pads may be patterned into any suitable shape (e.g., rectangular regions) and size, but are typically much wider than semiconductor regions 10A–10B. Polish monitor pads 16A–16B are approximately the same height as semiconductor regions 10A–10B on the same die, because they comprise the same layers 10 and 12. The polish monitor pads may have a larger surface area than semiconductor regions 10A–10B. For example, the polish monitor pads may have a surface area of about 20×20 $\mu m^2$ to 100×100 $\mu m^2$.

Figure 2C:
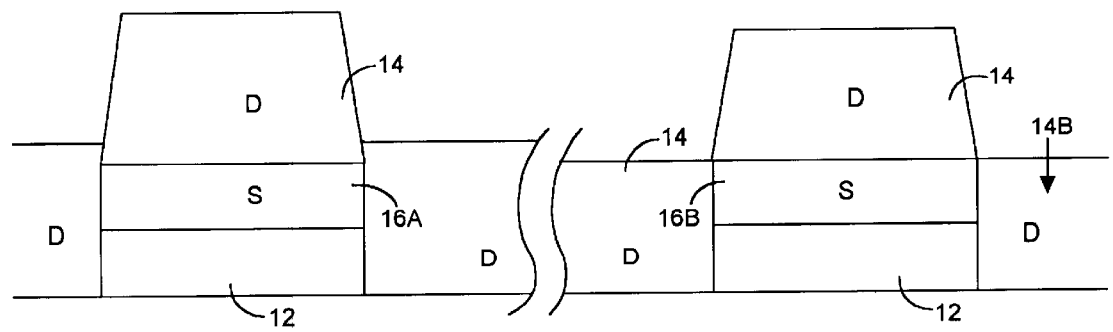
Figure 2D:
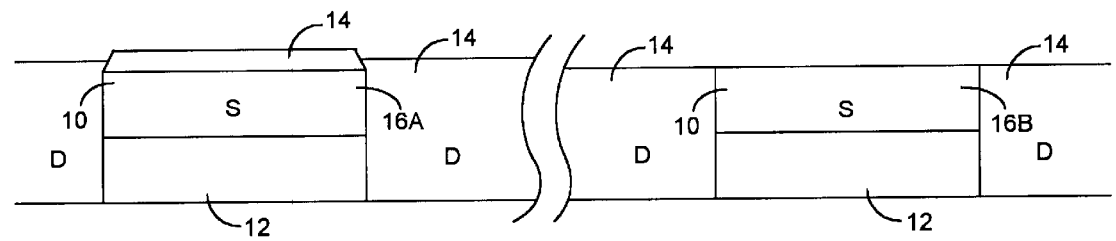

Next, dielectric layer 14 is deposited on the wafer between and on top of the polish monitor pads as shown in FIG. 2C. More dielectric deposits on top of pads 16A–16B than on regions 10A–10C, because pads 16A–16B are wider. For example, the maximum thickness of dielectric layer 14 deposits on top of pads 16A–16B. More dielectric in layer 14 accumulates on top of and adjacent to polish monitor pad 16A than on polish monitor pad 16B, because pad 16A is near the edge of the wafer and pad 16B is near the center of the wafer. Because polish monitor pads 16A–16B are spaced far apart relative to regions 10A–10C, little or no dielectric redeposition fills the gaps between the polish monitor pads. Dielectric layer 14 is targeted to fill up to upper surface 15 of layer 10 as discussed above.

Subsequently, CMP is performed to expose all of the pre-selected semiconductor regions as discussed above, by reducing the thickness of layer 14. Because a thicker layer of dielectric 14 accumulates on top of polish monitor pads 16A–16B than on semiconductor regions 10A–10C, a portion of dielectric layer 14 may remain on some of the polish monitor pads (such as pad 16A shown in FIG. 2D) after the CMP removal step is completed and all of the semiconductor regions 10A–10C are exposed. This is more likely to occur on die at the edge of the wafer where the height of layer 14 is greater.

On other polish monitor pads (such as pad 16B shown in FIG. 2D), all of dielectric layer 14 may be removed exposing semiconductor layer 10. This is more likely to occur on die near the center of the wafer where the height of layer 14 is smaller. The amount of dielectric 14 remaining on the polish monitor pads bears a direct relationship to the amount of dielectric left of top of the semiconductor regions (e.g., regions 10A–10B) on a corresponding die. This relationship can be measured and determined in advance to figure out how much of dielectric layer 14 needs to be removed from the top of the polish monitor pads to expose all of the pre-selected semiconductor regions on each of the die. Thus, the amount of dielectric 14 remaining on top of each polish monitor pad can be monitored after CMP to determine when semiconductor regions 10A–10C and other pre-selected semiconductor regions on the wafer have been exposed. The polish monitor pads help to prevent unnecessarily over-planarizing the wafer surface. If desired, a fab operator may look under a microscope at the polish monitor pads to observe visually the color of the structure to determine whether the pre-selected semiconductor regions were exposed.

If desired, all of layer 14 deposited on top of layer 10 can be removed from all parts of the wafer including the polish monitor pads during CMP. The height of layer 10 on the polish monitor pads can be correlated to the height of layer 10 in regions 10A–10C to determine the appropriate amount of CMP time needed to expose each of semiconductor regions 10A–10C.

Figure 3A:
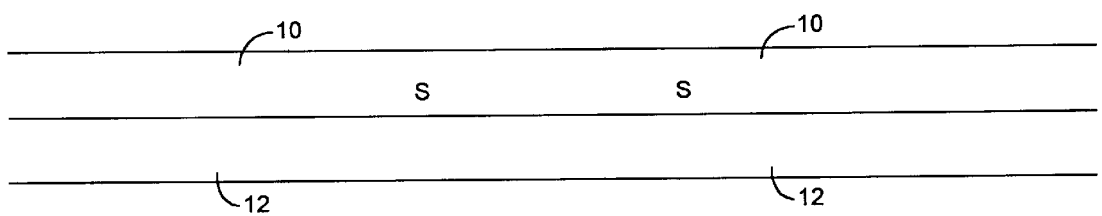
FIGS. 3A–3D are cross sectional diagrams showing process steps involving the formation and planarization of dielectric on top of polish monitors on the same die in accordance with the principles of the present invention.
Figure 3B:
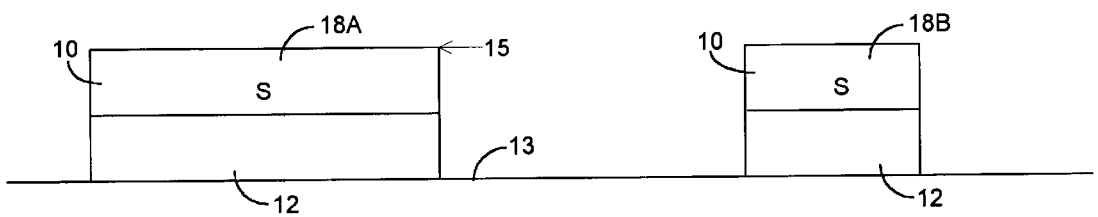
Figure 3C:
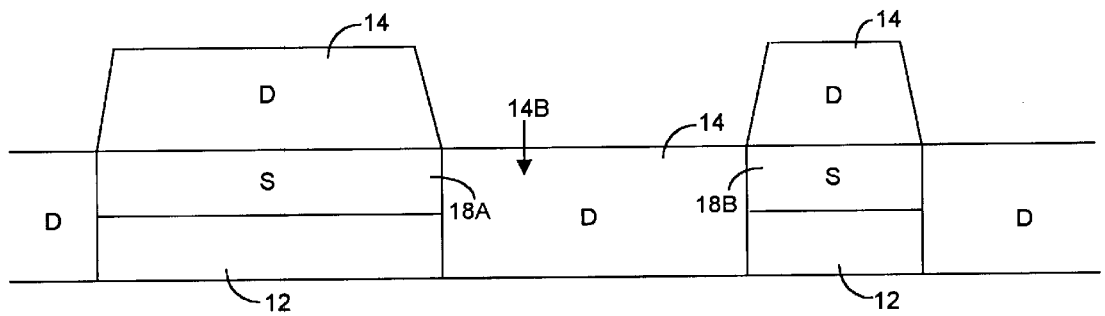
Figure 3D:
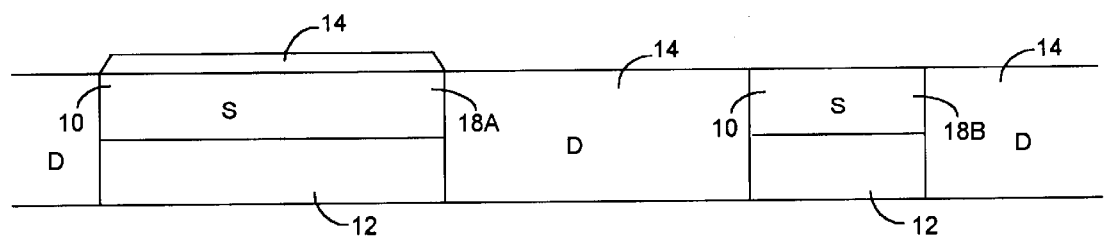

Example process steps for polish monitor pads of the present invention located on the same die are illustrated in FIGS. 3A–3D. The process steps for the polish monitor pads of FIGS. 3A–3D are the same as the process steps discussed above with respect to FIGS. 2A–2D, except that polish monitors pads 18A–18B are masked and etched to be different sizes as shown in FIG. 3B. Polish monitors pads 18A–18B are located on the same die of a wafer. Dielectric layer 14 is deposited on top of layer 10 as shown in FIG. 3C. The CMP removal step removes more dielectric from pad 18B than from pad 18A, because pad 18A is larger a shown in FIG. 3D. Different size polish monitor pads provide additional information for use in deriving a correlation between the amount of dielectric and/or semiconductor left on the polish monitor pads and the amount of semiconductor and dielectric left on the semiconductor regions. If desired, the color of different sized polish monitor pads may be observed through a microscope to determine if the pre-selected semiconductor regions were exposed.

Figure 4A:
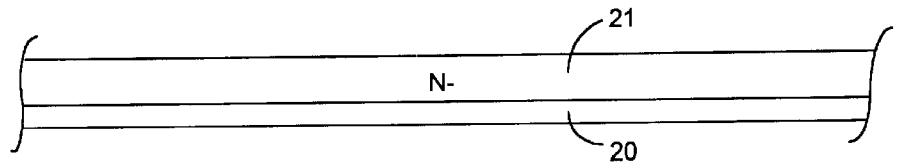
FIGS. 4A–4H are cross sectional diagrams showing another embodiment of process steps involving the formation of semiconductor and dielectric regions in accordance with the principles of the present invention.

In another embodiment of the present invention, semiconductor and dielectric regions may be formed according the process flow steps illustrated in FIGS. 4A–4G. FIGS. 4A–4G illustrate cross sectional views of process steps for forming elongated strips of semiconductor and dielectric, which extend into and out of the page. First, an antifuse layer 20 as shown in FIG. 4A is deposited or grown on a substrate. This typically is a 25–200 Å (angstroms) thick layer of silicon dioxide which can be deposited or grown with any one of very well-known processes. Subsequently, silicon layer 21 is deposited (e.g., typically 1000 –4000 Å thick) using a CVD (chemical vapor deposition) process where an n-type phosphorous dopant is deposited along with the deposition of, for instance, the polysilicon semiconductor material or where the n-type dopant is ion implanted following the deposition of the layer. This layer is, for example, doped to a level of $5 \times 10^{16}$–$10^{19}$/cm$^3$. Layer 21 can be deposited as amorphous silicon and re-crystallized later using, for example, an RTA (rapid thermal anneal) step.

Figure 4B:
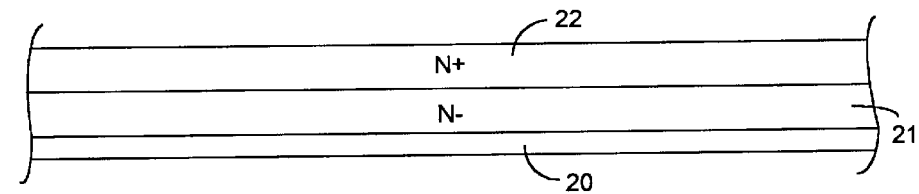

Subsequently, as shown in FIG. 4B a highly doped n+ layer 22 is deposited again using CVD. This layer may be approximately 300–3000 Å thick and in one embodiment is doped to a level of $>10^{19}$/cm$^3$. Adjacent silicon layers 21 and 22 are shown with different concentrations of n-type doping. These layers may be formed with one deposition followed by an ion implantation step at two different energy and/or dosage levels to obtain the two doping levels.

Figure 4C:
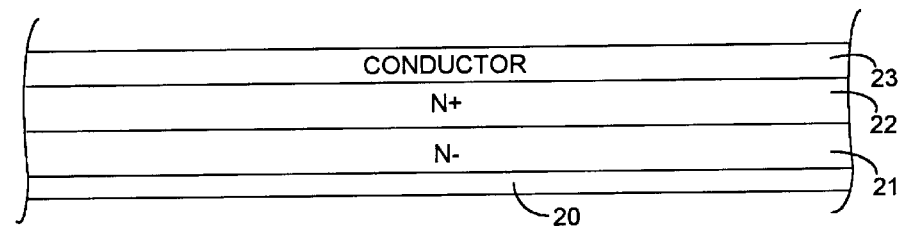
Figure 4D:
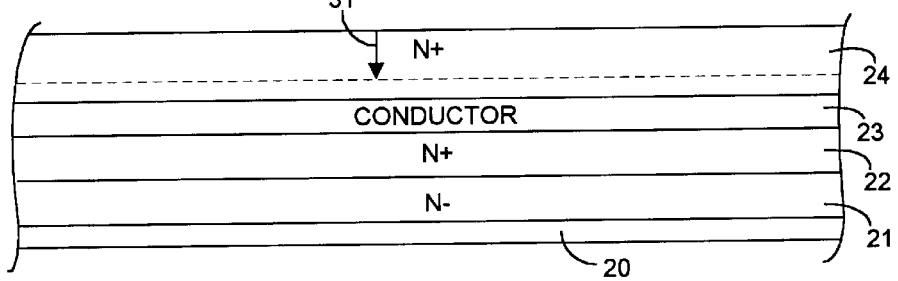

A conductive layer 23 which may be 500–1500 Å thick is formed using any one of numerous well-known thin film deposition processes such as sputtering as shown in FIG. 4C. A refractory metal may be used or a silicide of a refractory metal. Also, aluminum or copper can be used, or, more simply, heavily doped silicon can be the conductor.

Next, another semiconductor layer of, for instance, highly doped n+ polysilicon approximately 1500–2000 Å thick doped to a level of $>10^{19}$/cm$^3$ is formed on top of layer 23. This is shown as layer 24 in FIG. 4D. An upper portion 31 of layer 24 is a sacrificial silicon region, some or all of which may be removed during a subsequent CMP removal step. After the CMP step, the thickness of layer 24 is typically reduced to between 300 Å and 2000 Å thick.

Figure 4E:
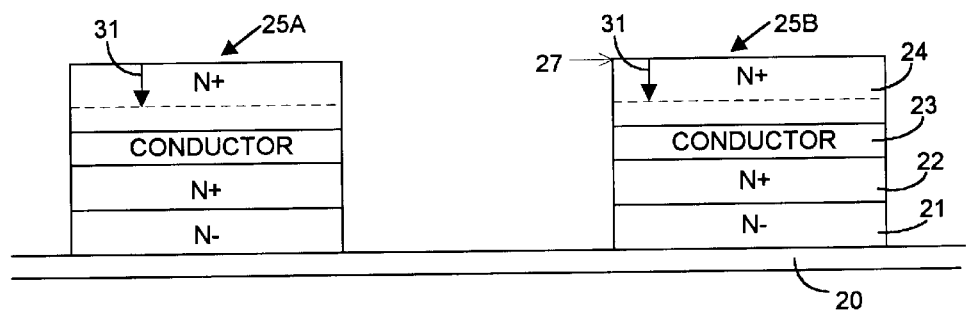

A masking and etching step is now used to define elongated strips of semiconductor regions, such as regions 25A and 25B shown in FIG. 4E. Regions 25A–25B may have a width of, for example, 0.25 µm (between left and right edges in FIG. 4E). An ordinary masking and etching step for instance using plasma etching, may be used. Etchants can be used that stop on antifuse layer 20, thus preventing this layer from being etched away. Thus, layer 20 can be considered an etchant stop layer depending on the specific etchants used.

Figure 4F:
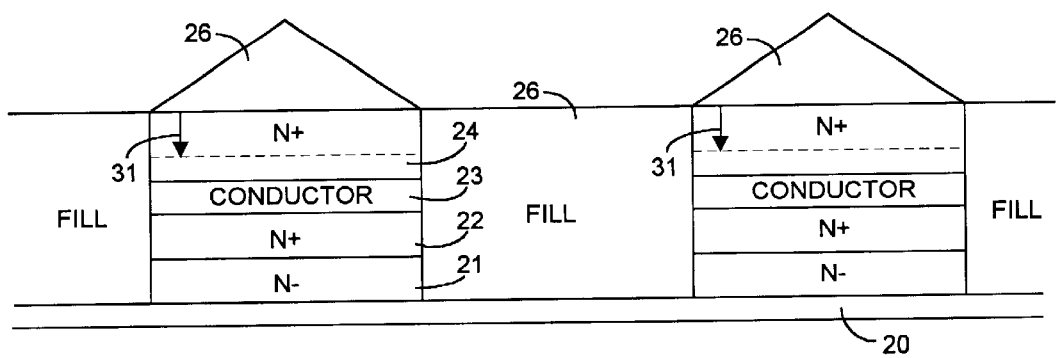

Now as shown in FIG. 4F, the spaces between the semiconductor regions 25A and 25B are filled with a dielectric layer 26 (e.g., SiO$_2$, SO$_x$, Borophosphosilicate glass (BPSG), phosphosilicate glass (PSG), or a low-k dielectric such as fluorosilicate glass (FSG)), which may be formed with a HDP-CVD process. Dielectric layer 26 is targeted to fill up to upper surface 27 of semiconductor layer 24 to reduce non-uniformities across the wafer as discussed above and shown in FIG. 4F. Dielectric layer 26 may overfill above upper surface 27 in gap fill areas adjacent to some of the semiconductor regions on the wafer (e.g., by 600 angstroms).

A CMP step is subsequently performed to planarize the upper surface of the wafer shown in FIG. 4F. This planarization can reduce the thickness of layer 24 to approximately 500 Å by removing some or all of sacrificial region 31. Thus, layer 24 may end up being approximately the same thickness as layer 22. More of sacrificial region 31 is removed near the center of the wafer if layer 26 is thinner there, and less of sacrificial region 31 is removed near the edge of the wafer if layer 26 is thicker near the wafer edges.

Figure 4G:
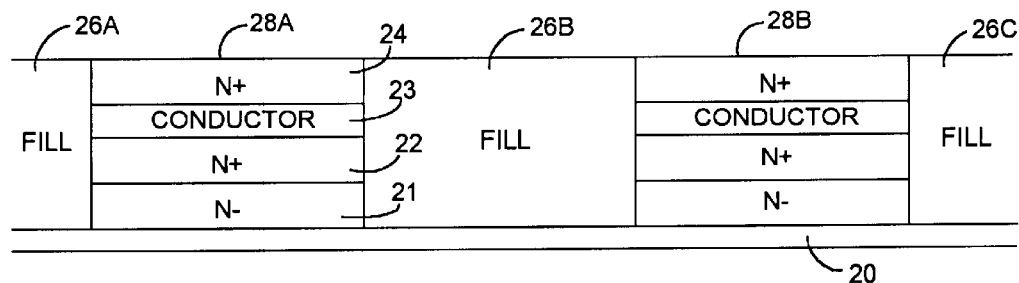
Figure 4H:
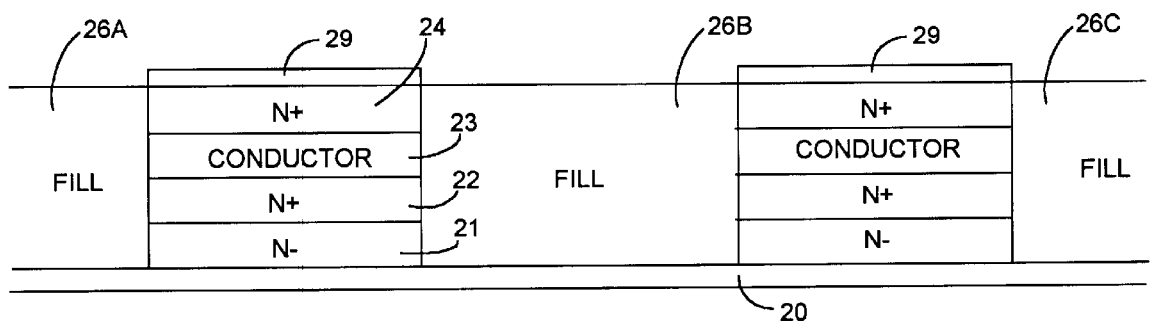

The removal step is performed so that all of dielectric layer 26 above semiconductor regions 25A and 25B is removed to expose their upper surfaces 28A–28B as shown in FIG. 4G. Dielectric layer 26 is completely removed from the upper surface of all of the pre-selected semiconductor regions on the wafer (not necessarily including polish monitor pads), so that each of the pre-selected semiconductor regions on the wafer is exposed. The dielectric is planarized down to the same height as the semiconductor strips to form dielectric gap fill strips, such as gap fill regions 26A–26C. The dielectric gap fill strips are located in between the semiconductor strips. Subsequently, antifuse layer 29 is deposited or grown on top of semiconductor layer 24. If layer 29 is deposited, it deposits on top of both semiconductor layer 24 and layer 26. If layer 29 is grown, it only grows on semiconductor layer 24, but not on layer 26 (such as in regions 26A–26C) as shown in FIG. 4H. Layer 29 typically is a 25–200 Å (angstroms) thick layer of silicon dioxide which can be deposited or grown with any one of very well-known processes.

The layered structure comprising alternating strips of dielectric and conductor/semiconductor, shown for example in FIG. 4H, may be employed in a memory array device. A plurality of these layered structures, each called a rail-stack, may be formed one on top of another. Each rail-stack level comprises semiconductor or conductor strips that are oriented perpendicular to the semiconductor/conductor strips above and below it. Each rail-stack level may comprise semiconductor strips of one doping type (e.g., n-type strips), that are the opposite doping type of semiconductor strips above and below it (e.g., p-type strips). The resulting memory array may comprise perpendicular semiconductor strips that are of alternating p- and n-type doping. Further features of a Three-Dimensional Memory Array and Method of Fabrication are described in U.S. patent application Ser. No. 09/560,626 to Knall, filed Apr. 28, 2000, which is hereby incorporated by reference herein in its entirety.

Irregularities in the CMP removal process can cause non-uniformities in the thickness of layers across the surface of a wafer, as discussed above. In memory array structures with multiple rail-stacks as shown for example in FIG. 5, CMP is performed to form each rail-stack. Because a large number of CMP removal steps are required to form a memory array structure with multiple rail-stacks, cumulative non-uniformities in the thickness of layers introduced by repeated CMP steps can cause substantial height variations across a wafer. The non-uniformities in layer thickness caused by CMP are larger in wafer structures that have larger surface height variations before CMP, because it takes longer to flatten the wafer surface. Thus, non-uniformities caused by CMP are reduced by providing a flatter wafer surface before a CMP process is performed.

Figure 5:
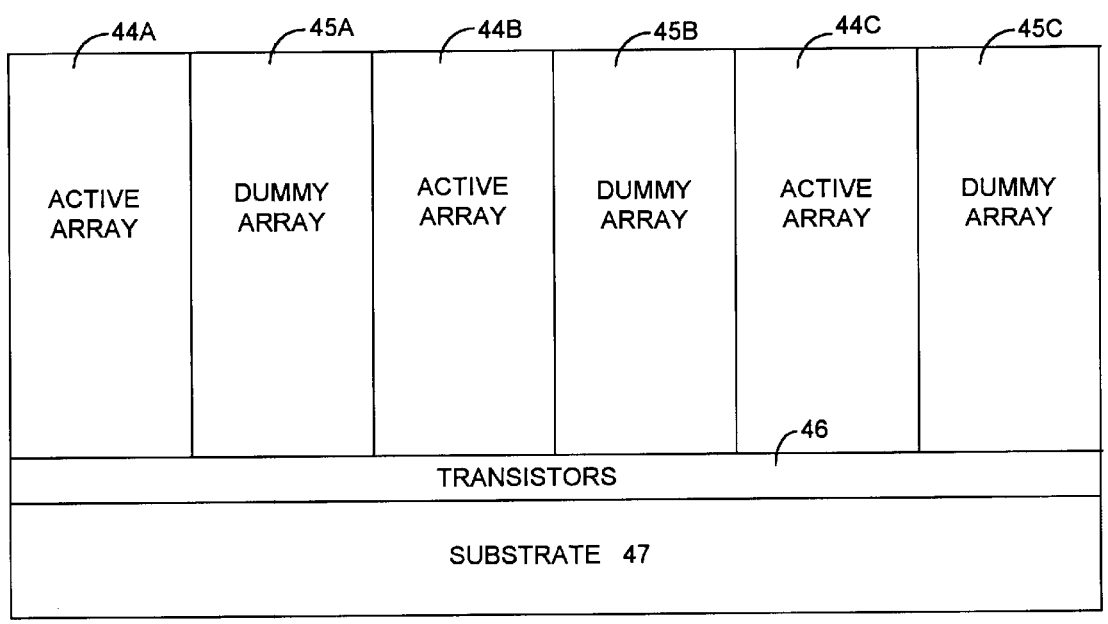
FIG. 5 is a cross sectional diagram of a multilevel memory array structure disposed above a substrate in accordance with the principles of the present invention.

Memory array structures of the present invention may be formed on substrate 47 as shown in FIG. 5. Transistors are formed in region 46, for example, to read data from and write data to the memory array structure. An active memory array is an array with rail-stacks that is electrically connected and used for data storage such as active arrays 44A–44C. An active array typically requires more transistors in region 46 that can fit underneath the active array. Thus, transistors in region 46 used by an active array may take up a greater area than the active array itself. Active arrays therefore cannot be formed directly adjacent to each other. Spaces exist between the active arrays.

If no rail-stacks at all are formed in between the active arrays, the height difference between the active arrays and the spaces between the active arrays is substantial. This height difference can be substantially reduced or eliminated by forming dummy arrays 45A–45C between active arrays 44A–44C as shown in FIG. 5. Dummy arrays 45A–45C have the same rail stacks as active arrays 44A–44C. The rail-stacks of dummy arrays 45A–45C are formed along with the rail-stacks of active arrays 44A–44C. Dummy arrays 45A–45C are not used for data storage or any other purpose except to even out the surface of the wafer in between active arrays 44A–44C. Preferably, the semiconductor strips (e.g., that comprise patterned layers 21–24) are the same width in dummy arrays 45A–45C as they are in active arrays 44A–44C (e.g., 0.25 $\mu$m), to reduce or eliminate surface height variations between these arrays caused by the deposition of the dielectric layer. Each time CMP is performed on a rail stack that includes dummy arrays along with the active arrays, non-uniformities in layer thickness introduced by the CMP process are reduced because there is little or no height difference between the dummy arrays and the active arrays.

Figure 6:
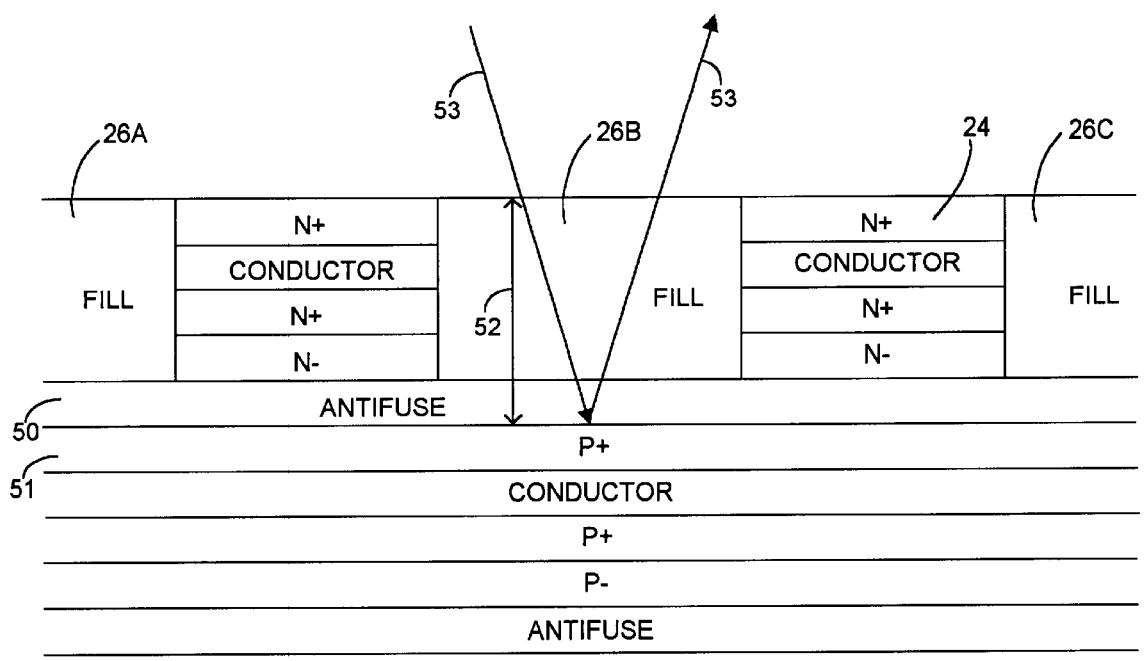
FIG. 6 is a cross sectional diagram showing how the thickness of a dielectric layer located in between semiconductor regions is measured in accordance with the principles of the present invention.

In a further embodiment of the present invention, the dielectric gap fill layer can be measured even though the thickness of the underlying semiconductor layer is variable because CMP has been performed on it. The thickness of the dielectric fill in layer 26 can be measured using a technique that is shown and discussed with respect to FIG. 6. The thickness of dielectric gap fill region 26B, for example, can be measured using reflectance spectroscopy or other techniques such as ellipsometry. Light beam 53 is passed through region 26B as shown in FIG. 6. Light beam 53 passes through dielectric antifuse layer 50 and dielectric region 26B. Light beam 53 reflects off the surface of p-type silicon region 51 and is passed back through region 26B. CMP is used to planarize p+ semiconductor layer 51 and therefore may have a varying thickness across the wafer, as discussed above with respect to layer 24 in FIG. 4G. In the case of reflectance spectroscopy, the thickness 52 of the rail-stack is determined by measuring the reflected light intensity as a function of its wavelength. Certain wavelengths of light 53 are attenuated more passing through thicker dielectric layers. The thickness of antifuse layer 50 may be subtracted to determine the thickness of dielectric region 26B. This technique can be used to determine the thickness of the gap fill dielectric to determine if the CMP step was successful at removing dielectric from the upper surface of the pre-selected semiconductor regions of layer 24 across the wafer (not necessarily including the polish monitor pads).

Persons skilled in the art further will recognize that the present invention may be implemented using structures and process steps other than those shown and discussed above. All such modifications are within the scope of the present invention, which is limited only by the claims which follow.

The invention claimed is:

1. A method for forming semiconductor regions and dielectric regions, comprising:
    depositing and patterning a layer of semiconductor on a wafer to form the semiconductor regions which each have an upper surface;
    depositing a layer of dielectric on top of the semiconductor regions, wherein the dielectric layer fills up to no more than 600 angstroms above the upper surface of the semiconductor regions in between the semiconductor regions; and
    removing a portion of the dielectric layer using chemical mechanical planarization so that the upper surface of each of the semiconductor regions is exposed.

2. The method of claim 1 wherein depositing and patterning the layer of semiconductor further comprises forming a plurality of polish monitor pads; and the method further comprises:
    measuring an amount of dielectric remaining on the polish monitor pads as a result of removing the portion of the dielectric layer using chemical mechanical planarization to determine when the upper surfaces of the semiconductor regions have been exposed.

3. The method of claim 1 wherein depositing and patterning the layer of semiconductor further comprises forming a plurality of polish monitor pads; and the method further comprises:
    measuring an amount of semiconductor remaining on the polish monitor pads as a result of chemical mechanical planarization to determine when the upper surfaces of the semiconductor regions have been exposed.

4. The method of claim 1 wherein depositing and patterning the layer of semiconductor further comprises forming a plurality of polish monitor pads; and the method further comprises:
    observing the color of the polish monitor pads after removing the portion of the dielectric layer using chemical mechanical planarization to determine when the upper surfaces of the semiconductor regions have been exposed.

5. The method of claim 1 wherein the layer of semiconductor comprises silicon.

6. The method of claim 1 wherein the layer of semiconductor is between 1500 and 2000 angstroms thick.

7. The method of claim 1 wherein the layer of semiconductor is greater than 5,000 angstroms thick.

8. The method of claim 1 wherein removing the portion of the dielectric layer using chemical mechanical planarization further comprises removing a sacrificial portion of the semiconductor layer from at least some of the semiconductor regions.

9. The method of claim 1 wherein the layer of dielectric comprises silicon dioxide.

10. The method of claim 1 wherein the regions of semiconductor are a part of an array in a memory structure.

11. The method of claim 1 wherein the semiconductor regions are doped with P-type dopants.

12. The method of claim 1 wherein the semiconductor regions are doped with N-type dopants.

13. The method of claim 1 wherein the semiconductor layer is deposited on top of another semiconductor layer.

14. The method of claim 1 wherein the semiconductor layer is deposited on top of a conductor layer.

15. The method of claim 1 further comprising:
measuring the thickness of a cross section of the dielectric layer by transmitting electromagnetic waves through the dielectric layer that reflect off of a second previously planarized semiconductor layer underneath the dielectric layer.

16. The method of claim 1 wherein the semiconductor and dielectric layers include active arrays and dummy arrays in a memory device structure.

17. A method for forming semiconductor regions having an upper surface and dielectric regions, comprising:
step for forming the dielectric regions in between the semiconductor regions by depositing a dielectric layer wherein the dielectric layer fills up to no more than 600 angstroms above the upper surface of the semiconductor regions in between the semiconductor regions and
step for reducing the thickness of the dielectric layer so that the upper surface of each of the semiconductor regions is exposed and each of the dielectric regions is substantially the same height as an adjacent semiconductor region.

18. The method of claim 17 further comprising:
measuring an amount of dielectric remaining on polish monitor pads as a result of the step for reducing the thickness of the dielectric layer to determine when the upper surfaces of the semiconductor regions have been exposed.

19. The method of claim 17 further comprising:
measuring an amount of semiconductor remaining on polish monitor pads as a result of the step for reducing the thickness of the dielectric layer to determine when the upper surfaces of the semiconductor regions have been exposed.

20. The method of claim 17 further comprising:
observing the color of polish monitor pads after the step for reducing the thickness of the dielectric layer to determine when the upper surfaces of the semiconductor regions have been exposed.

21. The method of claim 17 wherein the semiconductor regions comprise silicon.

22. The method of claim 17 wherein the semiconductor regions have a thickness between 1500 and 2000 angstroms.

23. The method of claim 17 wherein the step for reducing the thickness of the dielectric layer comprises using chemical mechanical planarization to reduce the thickness of the dielectric layer.

24. The method of claim 23 wherein a sacrificial portion of at least some of the semiconductor regions is removed during the chemical mechanical planarization.

25. The method of claim 17 wherein the dielectric layer comprises silicon dioxide.

26. The method of claim 17 wherein the regions of semiconductor comprise portions of arrays in a memory structure.

27. The method of claim 17 wherein the semiconductor regions are doped with P-type dopants.

28. The method of claim 17 wherein the semiconductor regions are doped with N-type dopants.

29. The method of claim 17 wherein the semiconductor regions comprise a plurality of patterned semiconductor layers.

30. The method of claim 17 wherein the semiconductor regions comprise a patterned semiconductor layer that is deposited on top of a conductor layer.

31. The method of claim 17 wherein the semiconductor and dielectric regions include arrays and dummy arrays in a memory device structure.

32. The method of claim 17 further comprising:
measuring the thickness of a cross section of the dielectric layer by transmitting electromagnetic waves through the dielectric layer that reflect off of a previously planarized semiconductor layer underneath the dielectric layer.

* * * * *